United States Patent [19]

Furukawa

[11] Patent Number: 4,953,655

[45] Date of Patent: Sep. 4, 1990

[54] ACOUSTIC APPARATUS

[75] Inventor: Kazunari Furukawa, Hamamatsu, Japan

[73] Assignee: Yamaha Corporation, Hamamatsu, Japan

[21] Appl. No.: 330,457

[22] Filed: Mar. 30, 1989

[30] Foreign Application Priority Data

Apr. 4, 1988 [JP] Japan .................................. 63-81344
Apr. 4, 1988 [JP] Japan .................................. 63-81345

[51] Int. Cl.[5] ................................................ H05K 5/00

[52] U.S. Cl. .................................... 181/160; 181/156; 181/199; 381/98; 381/159

[58] Field of Search ............... 181/141, 148, 155, 156, 181/160, 199; 381/93, 96, 98, 159

[56] References Cited

U.S. PATENT DOCUMENTS 4,301,332 11/1981 Dusawek ........................ 181/163 X

FOREIGN PATENT DOCUMENTS 2327697 5/1977 France ................................ 181/163
696671 9/1953 United Kingdom ................ 181/156

*Primary Examiner*—Benjamin R. Fuller

*Attorney, Agent, or Firm*—Spensley, Horn, Jubas & Lubitz

[57] ABSTRACT

Disclosed is a compact, wide-range acoustic apparatus which can perform lower bass sound reproduction and is free from noise or distortion components. Spatially separated first and second chambers are formed. The first and second chambers communicate with each other through a port, so that the first chamber and a resonance port constitute a Helmholtz resonator. An open port is formed in or a passive vibrating body is arranged on the outer wall surface of the second chamber, so that the second chamber and the opening or the passive vibrating body constitute an essential low-pass type acoustic filter. A vibrator is attached to the outer wall surface of the first chamber, so that the Helmholtz resonator is driven at the inner surface side of the vibrating body of the vibrator, and an acoustic radiation is directly performed from its outer surface side. The vibrator is driven to cancel an air counteraction from the resonator when the Helmholtz resonator is driven. A cutoff frequency of the acoustic filter is set to be higher than a resonance frequency of the Helmholtz resonator and to be lower than the open duct resonance frequency of the resonance port.

11 Claims, 10 Drawing Sheets

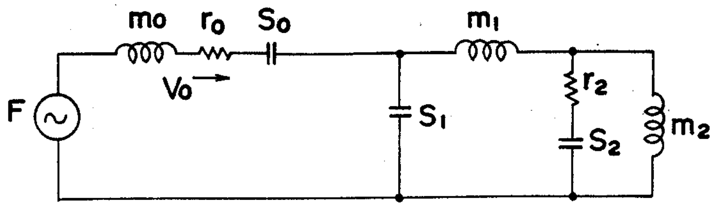
FIG. 3
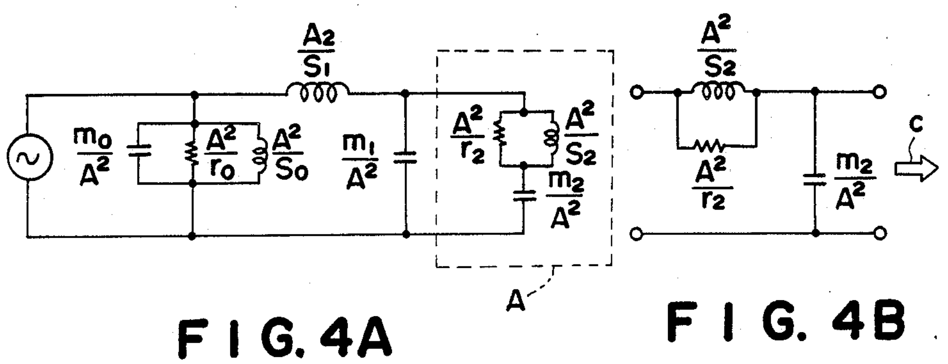
FIG. 4A
FIG. 4B
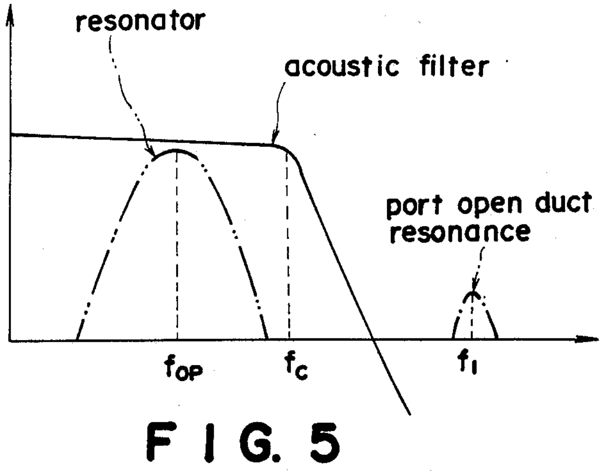
FIG. 5

ACOUSTIC APPARATUS

BACKGROUND OF THE INVENTION:

1. Field of the Invention

The present invention relates to an acoustic apparatus, utilizing a Helmholtz resonator, for radiating acoustic waves from both the resonator and a vibrator for driving the resonator and, more particularly, to a compact, wide-range acoustic apparatus which can perform lower bass sound reproduction and is free from noise or distortion.

2. Description of the Prior Art

As an acoustic apparatus utilizing a Helmholtz resonance, a phase-inversion (bass-reflex) speaker system is known. FIGS. 18A and 18B are respectively a perspective view and a sectional view showing an arrangement of the bass-reflex speaker system. In the speaker system shown in FIGS. 18A and 18B, a hole is formed in the front surface of a cabinet 1, a vibrator 4 consisting of a diaphragm 2 and a dynamic speaker 3 is mounted in the hole, and a resonance port 8 having a sound path 7 whose opening 6 is open to an external portion is formed therebelow In the bass-reflex speaker system according to the conventional basic design, a resonance frequency (antiresonance frequency) $f_{OP}$ defined by an air spring of the cabinet 1 and an air mass in the sound path 7 is set to be lower than a lowest resonance frequency $f_0$ of the vibrator (speaker) when the vibrator is assembled in the bass-reflex cabinet. At a frequency higher than the antiresonance frequency $f_{OP}$, the phase of the sound pressure from the rear surface of the diaphragm 2 is inverted at the sound path 7. Consequently, in front of the cabinet 1, a sound directly radiated from the front surface of the diaphragm 2 is in phase with a sound from the opening 6, thus increasing the sound pressure. As a result, according to an optimally designed bass-reflex speaker system, the frequency characteristics of the output sound pressure can be expanded to the resonance frequencies $f_0$ of the vibrator or less. As indicated by an alternate long and two short dashed curve in FIG. 19, a uniform reproduction range can be widened as compared to an infinite plane baffle or closed baffle.

However, in the bass-reflex speaker system, open duct resonance occurs at the resonance port portion, and the resonant sound is radiated as noise or a distortion component of an acoustic wave.

In order to eliminate such distortion or noise, another acoustic apparatus wherein a small-diameter portion is formed in the central portion of a port to eliminate port resonance has been proposed (Japanese Utility Model Publication No. sho 54-35068). However, in this case, as the diameter of the small-diameter portion is decreased to enhance a filter effect, an acoustic resistance of the port is increased, and the Q value of the Helmholtz resonance is decreased. As a result, the behaviour of the speaker system approximates an operation of a closed type speaker system, and its frequency characteristics approximate those indicated by an alternate long and short dashed curve in FIG. 19. Therefore, bass-sound radiation power is decreased.

FIG. 20 shows an arrangement of an acoustic apparatus as described in a co-pending U.S. application Ser. No. 07/286,869 filed Dec. 19, 1988 and commonly assigned with the present application. In the system shown in FIG. 20, the resonance frequency $f_{OP}$ of a Helmholtz resonator is set to be still lower than that of a conventional bass-reflex speaker system, and a vibrator for driving the Helmholtz resonator is driven to cancel an air counteraction from the resonator when the resonator is driven, thus realizing a compact acoustic apparatus which can perform lower bass sound reproduction. FIG. 21 shows frequency characteristics of a sound pressure of the system shown in FIG. 20.

In FIG. 21, a solid curve represents frequency characteristics of an acoustic sound pressure resonantly radiated from the resonance port 8 of the resonator, and a broken curve represents frequency characteristics of an acoustic sound pressure directly radiated from the converter (speaker).

However, in the system shown in FIG. 20, since the length of the resonance port is increased in order to reduce the cabinet size and to decrease the resonance frequency of the Helmholtz resonator, an open duct resonance frequency of the resonance port is about 500 Hz, i.e., is lower than that of the conventional bass-reflex cabinet. Since the resonator is driven as described above, the Q value of the Helmholtz resonator is higher than that of the conventional one, and the amount of air passing through the resonance port is increased. For this reason, the frequency and level of an open duct resonant sound cannot be ignored, as indicated by peaks at frequencies $f_l$ and $f_2$ in the characteristics curve of the resonator shown in FIG. 21.

SUMMARY OF THE INVENTION

The present invention has been made in consideration of the above situation, and has as its principal object to provide a compact acoustic apparatus which employs a Helmholtz resonator having a resonance port, can perform lower bass sound reproduction, and can prevent an unnecessary open duct resonant sound caused when the Helmholtz resonator is driven so as to eliminate noise or a radiated sound distortion.

It is a second object of the present invention to provide an acoustic apparatus in which sound sources, i.e., a vibrator and a Helmholtz resonant sound radiation port can be desirably arranged in accordance with a reproduction environment.

In order to achieve the above objects, according to the present invention, spatially separated first and second chambers are formed. The first and second chambers communicate with each other through a port, so that the first chamber and a resonance port constitute a Helmholtz resonator. An open port is formed in or a passive vibrating body is arranged on the outer wall surface of the second chamber, so that the second chamber and the opening or the passive vibrating body constitute an essential low-pass type acoustic filter. A vibrator is attached to the outer wall surface of the first chamber, so that the Helmholtz resonator is driven by the inner surface side of the vibrating body of the vibrator, and an acoustic radiation is directly performed from its outer surface side. The vibrator is driven to cancel an air counteraction from the resonator when the Helmholtz resonator is driven. A cutoff frequency of the acoustic filter is set to be higher than a resonance frequency of the Helmholtz resonator and to be lower than the open duct resonance frequency of the resonance port.

The "essential low-pass type acoustic filter" herein includes an LPF (low-pass filter) and a BPF (band-pass filter) which has a sufficiently low cutoff frequency at a low frequency side and does not attenuate a signal in a predetermined resonant sound frequency range, and also includes a BEF (band eliminate filter) which has a sufficiently high attenuation band within a range in which the open duct resonant sound can be sufficiently attenuated, and does not attenuate a signal in the resonance frequency range, and the like.

The first and second chambers are formed by partitioning a single cabinet but may be formed as spaces in two independent cabinets.

According to the present invention with the above-mentioned structure, the vibrator is driven to cancel an air counteraction from the resonator when the Helmholtz resonator is driven. More specifically, the vibrator is driven in a sufficiently damped state, i.e., a so-called "dead" state without being influenced by the air counteraction from the resonator side, i.e., the first chamber side. For this reason, the frequency characteristics of a directly radiated acoustic wave are not influenced by the volume of the space of the rear surface of the vibrator. The volume of the first chamber can be reduced as long as it serves as a cavity of the Helmholtz resonator and a chamber of the vibrator. When viewed from the Helmholtz resonator side, the fact that the vibrator is driven to cancel the air counteraction from the resonator side when the resonator is driven implies that the diaphragm of the vibrator becomes an equivalent wall which cannot be driven by the resonator side. Therefore, the Q value of the Helmholtz resonator is not influenced by the characteristics of the vibrator. Even if the resonance frequency $f_{OP}$ is decreased, a sufficiently high Q value can be assured. Thus, if the first chamber and hence, the cabinet are rendered compact, a bass sound (resonant sound) having a sufficient level can be generated by the Helmholtz resonator.

When the resonant sound passes the essential low-pass type acoustic filter constituted by the second chamber and the opening or the passive vibrating body, a frequency component higher than the cutoff frequency, e.g., an open duct resonant sound of the resonance port (duct), is cut off. Therefore, only the resonant sound from the Helmholtz resonator is essentially radiated outside the cabinet through the opening or the passive vibrating body.

In this manner, according to the present invention, the vibrating body of the vibrator directly radiates an acoustic wave having characteristics corresponding to a sufficiently dead state of the vibrator, and the opening or the passive vibrating body of the second chamber radiates a bass sound by Helmholtz resonance, from which distortion and noise components are removed by the low-pass filter.

According to the present invention, a compact, wide-range acoustic apparatus which can perform lower bass sound reproduction and is free from noise and distortion is provided.

When the first and second chambers are formed in a single cabinet, the system has an outer appearance similar to a conventional bass-reflex speaker system or a drone cone speaker system, and there is no strange aspect as to the shape of the speaker system.

When the first chamber with the vibrator and the second chamber with the opening or passive vibrating body as the radiation port of the Helmholtz resonant sound are formed in two separate cabinets, design margin of the two sound sources, e.g., the vibrating body of the vibrator and the Helmholtz resonant sound radiation port can be widened.

In the latter case, the outer appearance is very similar to a speaker system disclosed in Japanese Utility Model Laid-Open No. sho 55-46376. In this conventional system, a speaker unit is arranged in a first cabinet, and a closed space is defined behind this unit to constitute a drive portion. A passive vibrating body is disposed on a wall surface of a second cabinet which is spatially separated from the first cabinet so as to constitute a radiation portion. A space in front of the speaker unit in the first cabinet communicates with a space in the second cabinet through a communication pipe.

However, this speaker system reproduces a low frequency determined by a transformation ratio and an equivalent mass of the passive vibrating body and a speaker diaphragm, spaces in front of the speaker unit in the first cabinet, in the communication pipe, and in the second cabinet, and the drive portion does not contribute to external acoustic radiation at all. For this reason, a reproduction band is limited to the low range, and is narrow. In a system of this type, a speaker unit is driven at a constant voltage by a conventional power amplifier. In this case, if the diameter of the communication pipe is reduced and an acoustic resistance is increased, a radiation power of the drive portion is not enough to transmit acoustic energy to the radiation portion. Furthermore, a low frequency band to be reproduced is determined by spaces in front of the speaker unit in the first cabinet, in the communication pipe, and in the second cabinet. Thus, in order to realize lower bass sound reproduction, the system becomes large in size.

In contrast to this, according to the present invention, the vibrator is used for both directly radiating sounds in middle and high sound ranges and driving the resonator, and is driven to cancel an air counteraction from the resonator side, thus improving a direct radiation power of a bass sound range and allowing the resonator to radiate a sound in the bass sound range. For this reason, according to the present invention, there can be provided an acoustic apparatus which can perform wide-range acoustic reproduction from a bass sound range to middle and high sound ranges, which is not considered in a conventional system, although it has a smaller cabinet than that of the conventional system.

BRIEF DESCRIPTION OF THE DRAWINGS

FIG. 3 is a mechanically equivalent circuit diagram of the acoustic apparatus shown in FIG. 1;

FIGS. 4A and 4B are electrically equivalent circuit diagrams of the acoustic apparatus shown in FIG. 1;

FIG. 5 is a graph showing input/output characteristics of a portion A shown in FIG. 4A corresponding to a mechanical acoustic filter of the apparatus shown in FIG. 1;

DETAILED DESCRIPTION OF THE PREFERRED EMBODIMENTS

Figure 1:
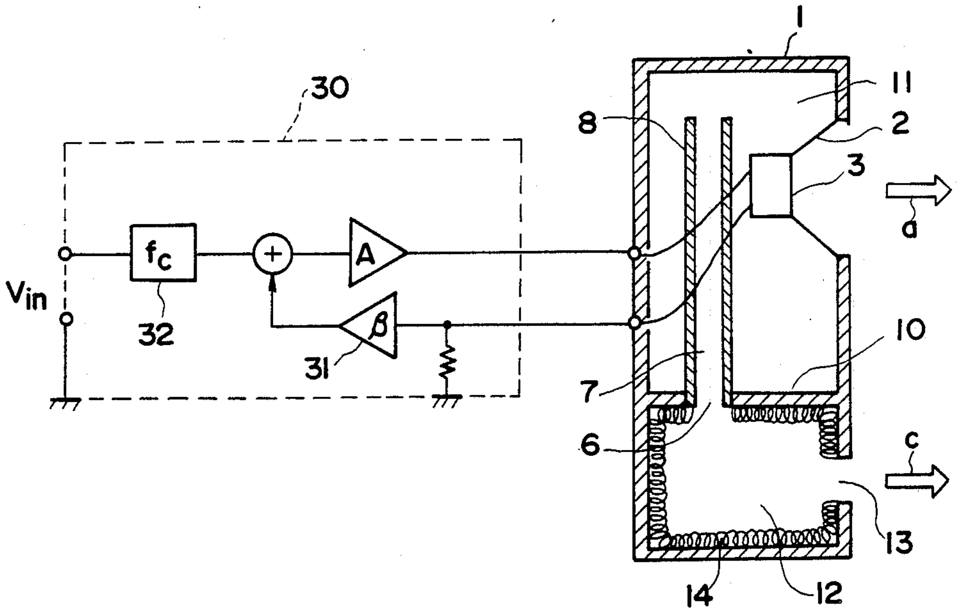
FIG. 1 is a diagram for explaining an arrangement of an acoustic apparatus according to a first embodiment of the present invention.

Preferred embodiments of the present invention will now be described with reference to FIGS. 1 to 17. Note that the same reference numerals in the following description denote the common or corresponding components in the apparatuses shown in FIGS. 18 and 20.

First Embodiment

FIG. 1 shows a basic arrangement of an acoustic apparatus according to a first embodiment of the present invention. In an acoustic apparatus (speaker system) shown in FIG. 1, the interior of a cabinet 1 is partitioned into first and second chambers 11 and 12 by a partition wall 10, and the first and second chambers 11 and 12 communicate with each other through a resonance port 8. An opening 13 is formed in a portion of the front surface of the cabinet 1 which constitutes the second chamber 12. A hole is formed in a portion constituting the first chamber 11 above the opening 13, and a vibrator (speaker unit) 4 constituted by a diaphragm 2 and a dynamic electro-acoustic converter 3 is mounted in the hole. The first chamber 11 and the resonance port 8 constitute a Helmholtz resonator. In this Helmholtz resonator, an air resonance phenomenon is caused by an air spring in the first chamber 11 as a closed cavity and an air mass in a sound path 7 of the resonance port 8. A resonance frequency $f_{OP}$ is given by:

$$f_{OP} = c(S/lV)^{\frac{1}{2}}/2\pi \qquad (1)$$

where c is the sonic speed, S is the sectional area of the sound path 7, l is the length of the resonance port 8, and V is the volume of the first chamber 11.

In the acoustic apparatus of this embodiment, the converter 3 of the vibrator 4 is connected to a vibrator driver 30. The vibrator driver 30 comprises a servo unit 31 for performing an electrical servo so as to cancel an air counteraction from the resonator when the Helmholtz resonator constituted by the first chamber 11 and the resonance port 8 is driven. The servo system can be one which drives the vibrator, the converter, and the like so as to cancel an internal impedance inherent in the converter 3. As the servo system, a known circuit, such as a negative impedance generator for equivalently generating a negative impedance component ($-Z_0$) in an output impedance, a motional feedback (MFB) circuit for detecting a motional signal corresponding to the behavior of the diaphragm 2 and negatively feeding back the signal to the input side by a proper means, or the like may be employed. A low-pass filter 32 is arranged to allow a signal in a range of this speaker system to pass therethrough and to supply it to the vibrator 4.

An operation of the acoustic apparatus with the arrangement shown in FIG. 1 will be described below.

When a drive signal is supplied from the vibrator driver 30 to the vibrator 4, the converter 3 electromechanically converts the drive signal to reciprocate the diaphragm 2 in the back-and-forth direction (right-and-left direction in FIG. 1). The diaphragm 2 mechanical-acoustically converts the reciprocal movement. The front surface side (right surface side in FIG. 1) of the diaphragm 2 constitutes a direct radiation portion for directly externally radiating an acoustic wave, and the rear surface side (left surface side in FIG. 1) of the diaphragm 2 constitutes a resonator driving portion for driving the Helmholtz resonator constituted by the first chamber 11 and the resonance port 8. Although an air counteraction from the air in the first chamber 11 acts on the rear surface side of the diaphragm 2, the vibrator driver 30 is servo-driven so as to apparently invalidate or eliminate a voice coil resistance of the vibrator 4. Thus, the vibrator 4 is driven to cancel the air counteraction.

In this manner, since the vibrator 4 is driven to cancel the air counteraction from the resonator when the Helmholtz resonator is driven, the diaphragm 2 cannot be driven from the side of the resonator, and serves as a rigid body, i.e., a wall. Therefore, the resonance frequency and the Q value of the Helmholtz resonator are independent from those of the vibrator 4 as the direct radiation portion, and the resonator drive energy from the vibrator 4 is given independently of the direct radiation portion. Since the vibrator 4 is driven in a so-called "dead" state wherein it is not influenced by the air counteraction from the resonator, i.e., the first chamber 11, the frequency characteristics of a directly radiated acoustic wave are not influenced by the volume of the first chamber 11. Therefore, according to the arrangement of this embodiment, the volume of the first chamber 11 as the cavity of the Helmholtz resonator can be reduced as compared to a conventional bass-reflex speaker system. In this case, if the resonance frequency $f_{OP}$ is set to be lower than that of the conventional bass-reflex speaker system, a sufficiently high Q value can be set. As a result, in the acoustic apparatus shown in FIG. 1, the first chamber 11 is reduced in size as compared to the bass-reflex speaker system, and reproduction of lower bass sounds can be performed.

In FIG. 1, the converter 3 drives the diaphragm 2 in response to the drive signal from the vibrator driver 30, and independently supplies drive energy to the Helmholtz resonator constituted by the first chamber 11 and the resonance port 8. Thus, an acoustic wave is directly radiated from the diaphragm 2 as indicated by an arrow *a* in FIG. 1. At the same time, air in the cabinet 1 is resonated, and an acoustic wave having a sufficient sound pressure can be resonantly radiated from an opening 6 of the resonance port 8 as indicated by an arrow *c* in FIG. 1.

Figure 20:
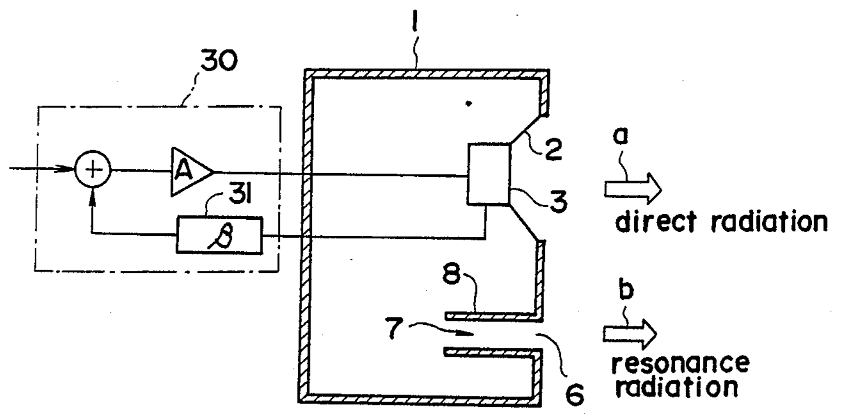
F I G. 20 PRIOR ART
FIG. 20 is a sectional view showing an arrangement of a speaker system according to a prior application.

A system shown in FIG. 20 in which the resonance port 8 is directly open to an external portion will be examined again. In this case, the Helmholtz resonant sound is radiated outside the cabinet 1, as indicated by arrow *b* in FIG. 20, the resonance frequency $f_{OP}$ is set to be lower than a reproduction frequency range of the converter 3 by adjusting an air equivalent mass in the sound path 7 of the resonance port 8 in the Helmholtz resonator, and a sound pressure of a proper level can be obtained from the opening 6 of the resonance port 8 by adjusting an equivalent resistance of the sound path 7 to set the Q value to be an optimal level. Under these conditions, the frequency characteristics of a sound pressure shown in, e.g., FIG. 21 can be obtained.

Figure 21:
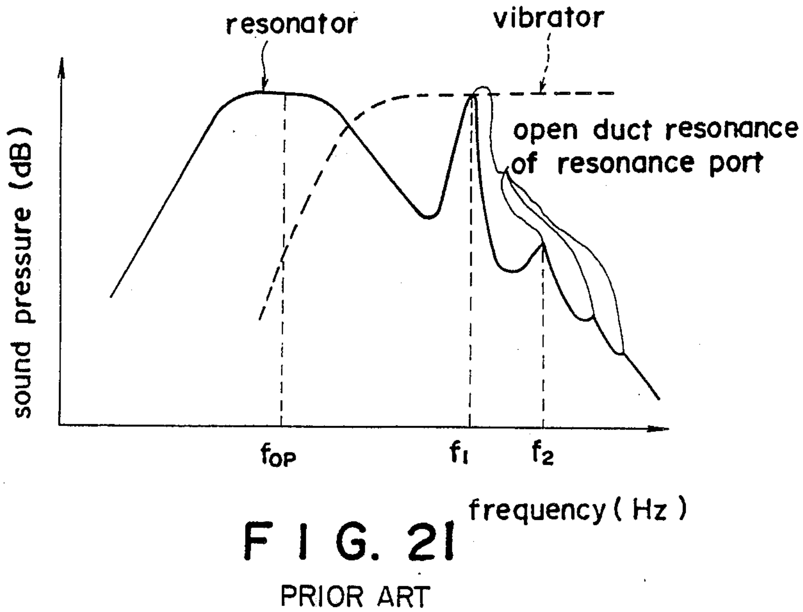
F I G. 21 PRIOR ART
FIG. 21 is a graph for explaining sound pressure characteristics of the speaker system shown in FIG. 20.

In the system shown in FIG. 20, the resonance port 8 suffers from open duct resonance by an air flow passing through the resonance port 8 by Helmholtz resonance, and acoustic waves having frequencies:

$$f_1=c/2l \quad (2)$$

$$f_2=c/4l \quad (3)$$

by the open duct resonance are radiated as indicated by a solid curve in FIG. 21. These waves are mixed in a resonantly radiated acoustic wave of the Helmholtz resonator as a distortion or noise component. This drawback is posed when the vibrator (speaker unit) 4 is driven by a conventional power amplifier of a constant voltage drive system, and is particularly conspicuous when the Q value of the Helmholtz resonator is improved to increase the sound pressure of the resonance radiation by driving the converter 3 to cancel the air counteraction from the Helmholtz resonator.

In the embodiment shown in FIG. 1, a resonant sound from the resonance port 8 is radiated through the second chamber 12 and the opening 13.

FIG. 3 shows a mechanically equivalent circuit of the apparatus shown in FIG. 1. FIG. 4A shows an electrically equivalent circuit of FIG. 3. In FIG. 3, reference symbol $m_0$ denotes an equivalent mass of a vibration system (speaker); $r_0$, an equivalent resistance of the vibration system; $S_0$, an equivalent stiffness of the vibration system; $m_1$, an equivalent mass of the resonance port 8; $S_1$, an equivalent stiffness of the main cabinet (first chamber) 11; $m_2$, an equivalent mass of the opening 13; $r_2$, an equivalent resistance by a sound absorbing member 14 on the wall surface of the front cabinet (second chamber) 12; and $S_2$, an equivalent stiffness of the second chamber 12. Reference symbol A denotes a force coefficient. When the vibrator 4 comprises a dynamic electro-acoustic converter (speaker), $A=Bl_v$ is established where B is the magnetic flux density in a magnetic gap and lv is the wire length of a voice coil conductor.

In FIG. 4A, a portion A is an equivalent circuit corresponding to the second chamber 12 and the opening 13. FIG. 4B is an equivalent circuit rewriting the portion A of FIG. 4A to have the opening 13 as an output terminal. As can be understood from these equivalent circuits, the second chamber 12 and the opening 13 constitute a secondary LPF (low-pass filter).

Figure 2:
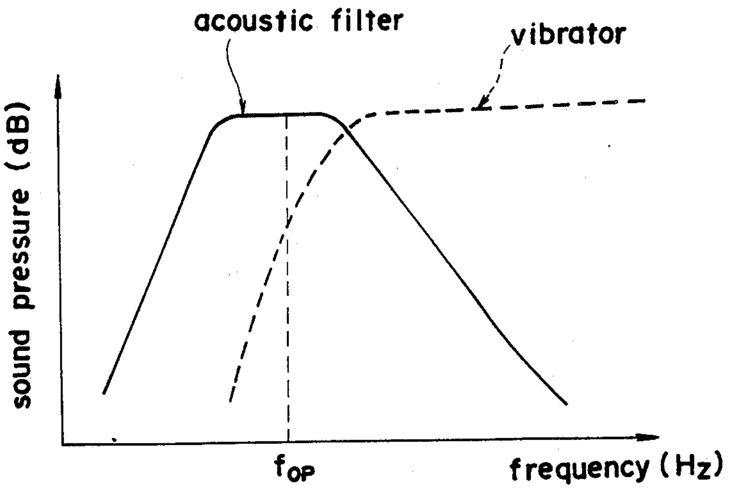
FIG. 2 is a graph showing frequency characteristics of a sound pressure of an acoustic wave radiated from the acoustic apparatus shown in FIG. 1.

In the embodiment shown in FIG. 1, the volume of the second chamber 12 and the area of the opening 13 are appropriately selected, so that a cutoff frequency $f_C$ of the LPF is set to be a value (e.g., 150 Hz) higher than the Helmholtz resonance frequency $f_{OP}$ (e.g., 50 Hz) and lower than a fundamental frequency $f_1$ (e.g., 500 Hz) of the open duct resonance. Therefore, when the resonant sound from the resonance port 8 is radiated through the LPF constituted by the second chamber 12 and the opening 13, open duct resonance frequencies appearing as peaks at the positions of frequencies $f_1$ and $f_2$ in FIG. 21, i.e., noise or distortion components caused by open duct resonance can be reduced or removed, as shown in FIG. 2. Note that the sound absorbing member 14 such as glass wool adhered to the wall surface in the second chamber 12 is arranged to appropriately prevent resonance in the second chamber 12.

Modification of First Embodiment

Figure 6:
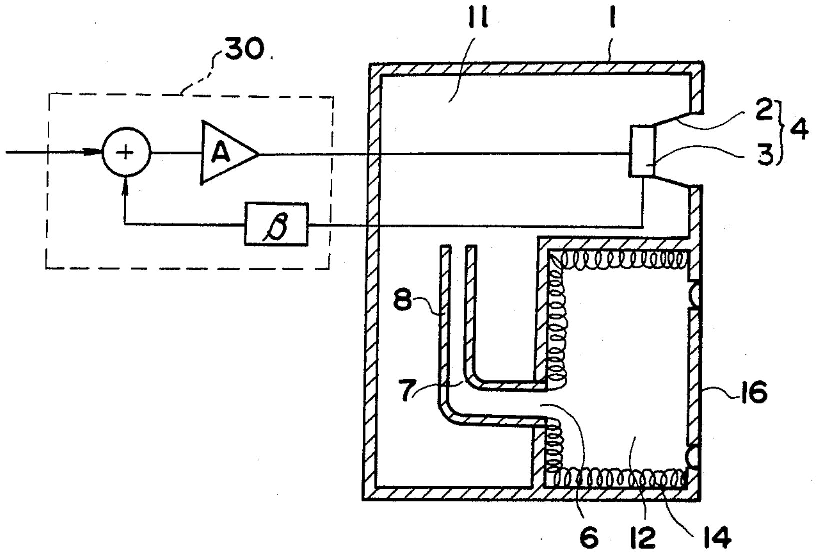
FIG. 6 is a diagram for explaining an acoustic apparatus according to a modification of the first embodiment.
Figure 7:
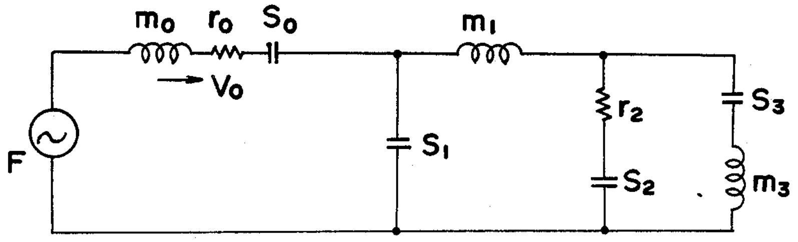
FIG. 7 is a mechanically equivalent circuit diagram of the acoustic apparatus shown in FIG. 6.
Figure 8A:
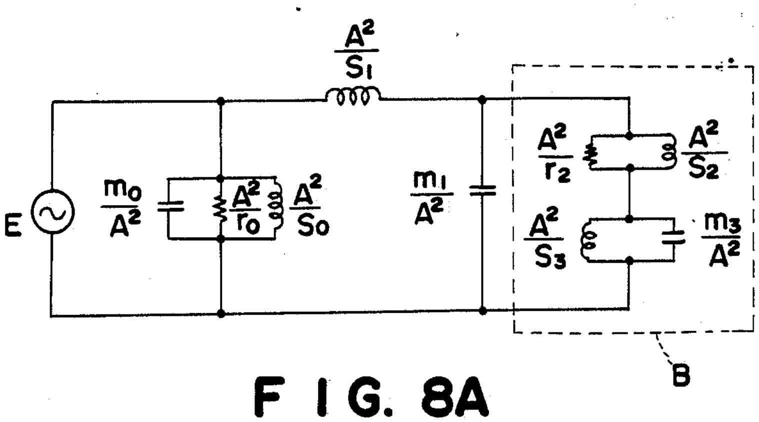
FIGS. 8A and 8B are electrically equivalent circuit diagrams of the acoustic apparatus shown in FIG. 6.
Figure 8B:
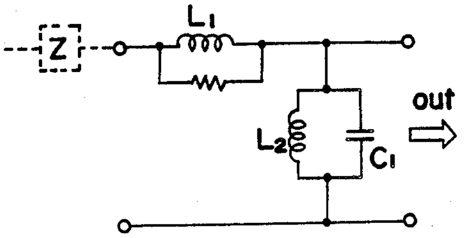
Figure 9:
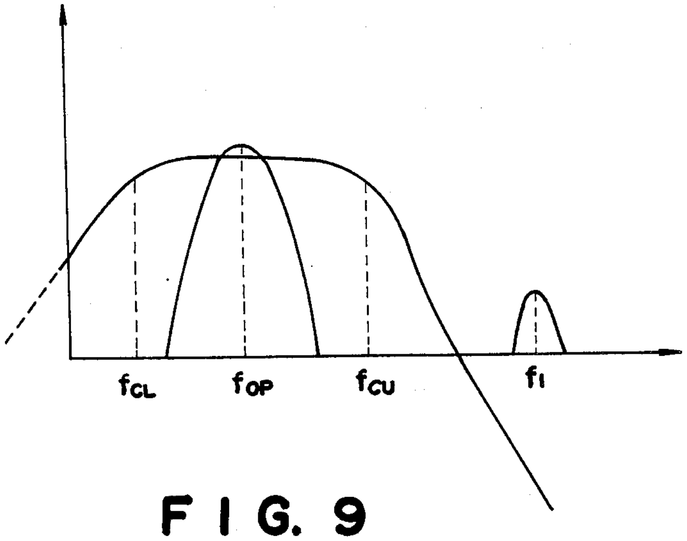
FIG. 9 is a graph showing input/output characteristics of a portion B shown in FIG. 8A.

FIG. 6 shows modification wherein a passive vibrating body 16 is arranged in place of the opening 13 in FIG. 1. FIG. 7 and FIGS. 8A and 8B respectively show a mechanically equivalent circuit and electrically equivalent circuits of the arrangement shown in FIG. 6.

In these drawings, reference symbols $m_0$, $m_1$, $r_0$, $r_2$, $s_0$, $s_1$, and A are common to those defined in FIG. 3. Reference symbol $m_3$ denotes an equivalent mass of the passive vibrating body 16; and $S_3$, an equivalent support stiffness of the passive vibrating body 16.

A portion B in FIG. 8A corresponding to the second chamber 12 and the passive vibrating body 16 in the arrangement shown in FIG. 6 can be rewritten to have the passive vibrating body 16 as an output terminal, as shown in FIG. 8B, and constitutes a BPF (band-pass filter), as can be seen from FIG. 8B. Therefore, in the arrangement shown in FIG. 6, the volume of the second chamber 12 and the equivalent mass of the passive vibrating body 16 are appropriately selected, a sound absorbing member such as glass wool is filled in the second chamber 12, and so on, so that an upper cutoff frequency $f_{CU}$ of the BPF is set to be a value (e.g., 150 Hz) higher than the Helmholtz resonance frequency fOP (e.g., 50 Hz) and lower than a fundamental frequency fl (e.g., 500 Hz) of the open duct resonance, and its lower-limit cutoff frequency $f_{CL}$ is set to be a value sufficiently lower than the resonance frequency $f_{OP}$. When a resonant sound from the resonance port 8 is radiated through this BPF, i.e., the second chamber 12 and the passive vibrating body 16, open duct resonance frequencies appearing as peaks at the positions of frequencies $f_l$ and $f_2$ in FIG. 21, i.e., noise or distortion components caused by open duct resonance can be reduced or removed, as shown in FIG. 2. Note that the sound absorbing member 14 such as glass wool adhered to the wall surface in the second chamber 12 serves as a damper for appropriately suppressing resonance caused by the second chamber 12 and the opening 13.

Second Embodiment

Figure 10:
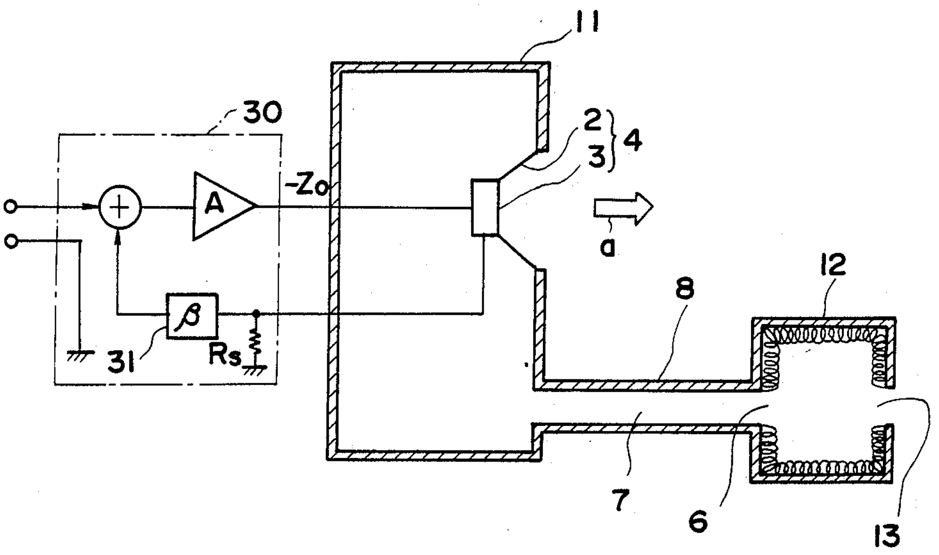
FIG. 10 is a diagram for explaining an arrangement of an acoustic apparatus according to a second embodiment of the present invention.

FIG. 10 shows a basic arrangement of an acoustic apparatus (speaker system) according to a second embodiment of the present invention. In the acoustic apparatus shown in FIG. 10, first and second chambers are formed in separate cabinets unlike in the first embodiment shown in FIG. 1. More specifically, in the acoustic apparatus shown in FIG. 10, a first cabinet (first chamber) 11 and a second cabinet (second chamber) 12 communicate with each other through a duct (resonance port) 8. A hole is formed in the wall surface of the first cabinet 11, and a vibrator (speaker unit) 4 constituted by a diaphragm 2 and a dynamic electro-acoustic converter (speaker) 3 is mounted in the hole. An opening 13 is formed in the wall surface of the second cabinet 12.

Although the outer appearance of the acoustic apparatus shown in FIG. 10 is different from that shown in FIG. 1, they are quite equivalent in an acoustic sense. More specifically, the resonance frequency $f_{OP}$ of the Helmholtz resonator constituted by the first cabinet 11 and the duct 8 is given by the following equation as in equation (1):

$$f_{OP}=c(S/lV)^{\frac{1}{2}}/2\pi$$

A mechanically equivalent circuit of the apparatus shown in FIG. 10 is as shown in FIG. 3, electrically equivalent circuits are as shown in FIGS. 4A and 4B, and characteristics of the resonator and characteristics of an acoustic filter constituted by the second cabinet 12 and the opening 13 are as shown in FIG. 5 as in the apparatus shown in FIG. 1.

Note that the opening 6 of the duct 8 and the opening 13 are preferably arranged to oppose each other as strictly as possible so as not to disturb and air flow in the duct 8. This also applies to the first embodiment.

According to the second embodiment, since two sound sources, i.e., the vibrator 4 and a bass sound source (resonant sound radiation port) can be arranged at different locations separated by the duct 8, the sound sources can be relatively freely arranged in addition to the effects of the first embodiment.

Modifications of Second Embodiment

Figure 11A:
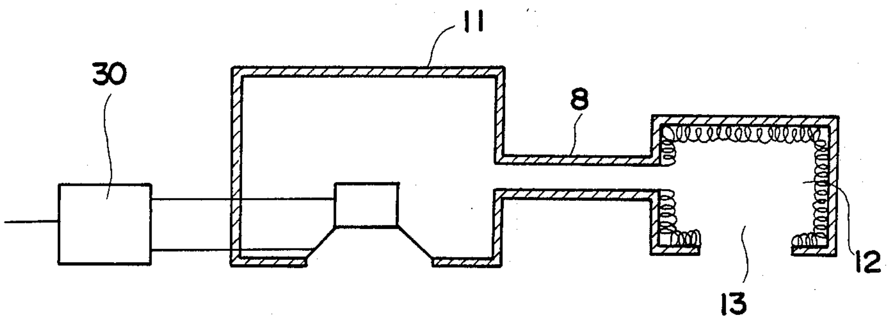
FIGS. 11A and 11B and FIGS. 12 to 17 are diagrams showing arrangements of acoustic apparatuses according to modifications of the second embodiment, respectively.
Figure 11B:
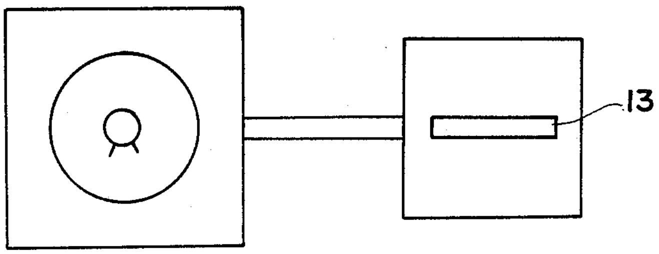

In FIG. 11A and 11B, the first cabinet 11 and the second cabinet 12 are juxtaposed, and the duct 8 is connected to opposing side surfaces of the first and second cabinets. In addition, the vibrator 4 and the opening 13 are formed in the front surfaces of the first and second cabinets. The opening 13 is formed into a rectangular slit.

Figure 12:
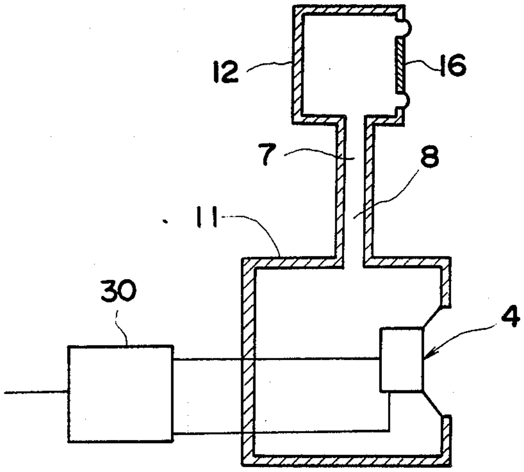

FIG. 12 shows a modification wherein a passive vibrating body (flat drone cone) 16 is arranged in place of the opening (rectangular slit) 13 in FIG. 10. The apparatus shown in FIG. 12 is equivalent to that shown in FIG. 6 in an acoustic sense, and operates in the same manner as in FIG. 6. For example, the second cabinet 12 and the passive vibrating body 16 constitute and acoustic filter which is represented by equivalent circuits shown in FIG. 7 and FIGS. 8A and 8B, and has characteristics shown in FIG. 9, as the apparatus shown in FIG. 6.

Figure 13:
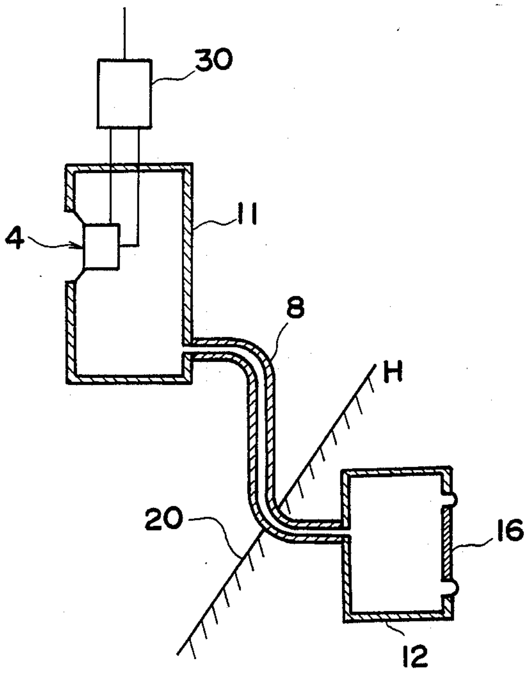

FIG. 13 shows a modification wherein the second cabinet 12 is arranged in a room H separate from that in which the first cabinet 11 is placed, and the duct 8 extends from the rear surface of the first cabinet 11 and is connected to the second cabinet 12 through a partition wall 20 of the room.

Figure 14:
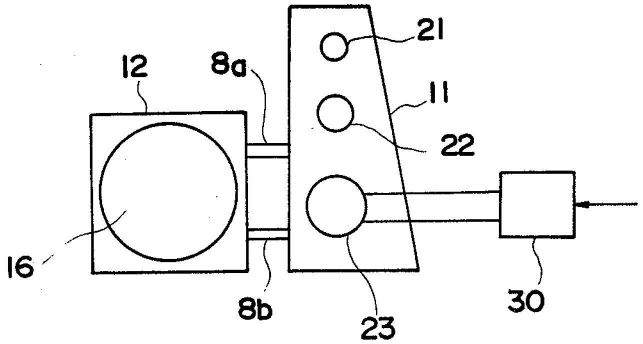

FIG. 14 shows a modification wherein the present invention is applied to a so-called 3-way speaker system. Side surfaces of the juxtaposed first and second cabinets 11 and 12 are connected through two ducts 8*a* and 8*b*. A tweeter 21, a mid-range speaker 22, and a woofer 23 are arranged on the first surface of the first cabinet 11, and the passive vibrating body 16 is arranged on the front surface of the second cabinet 12.

Figure 15:
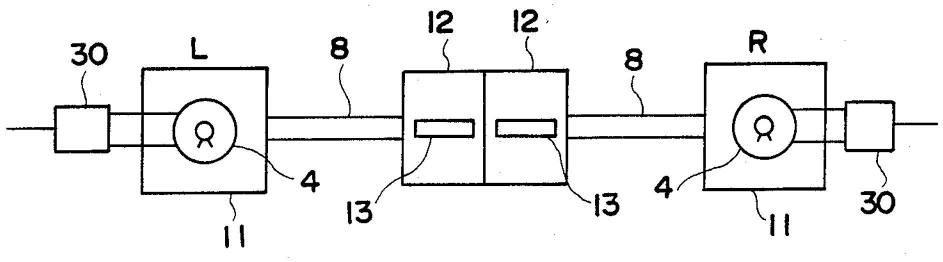
Figure 16:
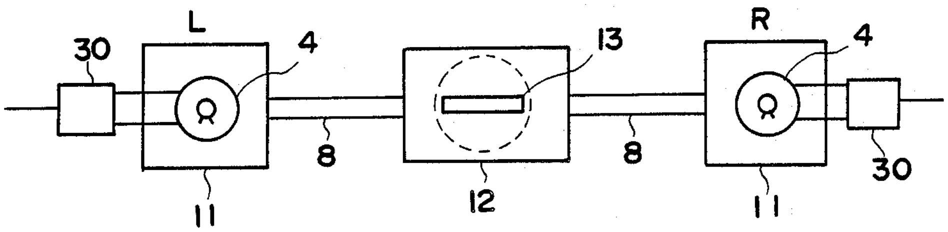
Figure 17:
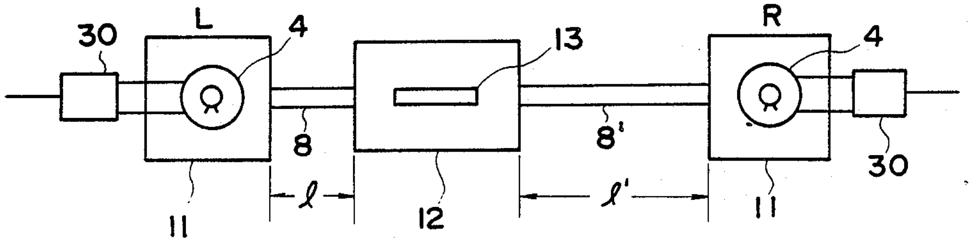
Figure 18A:
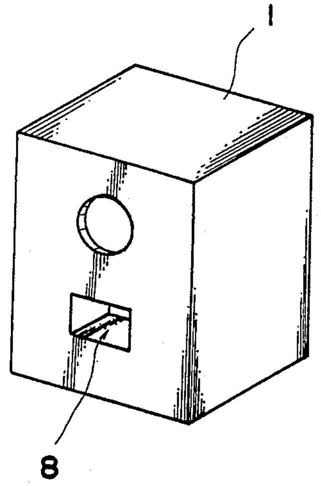
FIG. 18A PRIOR ART
FIGS. 18A and 18B are respectively a perspective view and a sectional view showing an arrangement of a conventional bass-reflex speaker system.
Figure 18B:
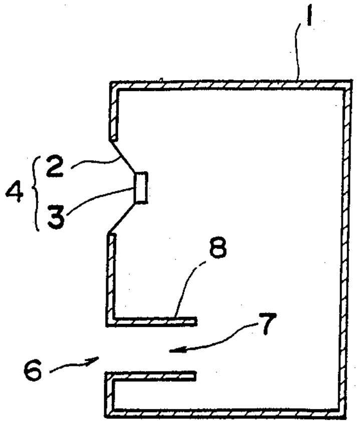
FIG. 18B PRIOR ART
Figure 19:
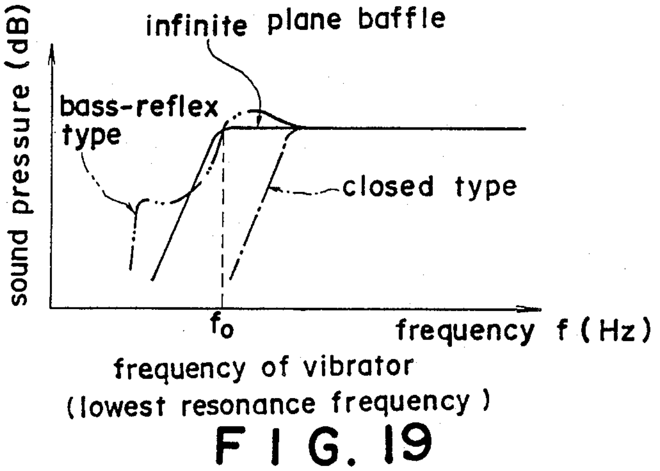
FIG. 19 PRIOR ART
FIG. 19 is a graph for explaining sound pressure characteristics of the speaker system shown in FIGS. 18A and 18B.

FIGS. 15 to 17 show modifications wherein the present invention is applied to a 3D (three-dimensional) system. FIG. 15 shows a modification wherein two systems shown in FIG. 11 are symmetrically arranged so that left and right second cabinets 12 are arranged adjacent to each other at the center. FIG. 16 shows a modification wherein a single second cabinet 12 is commonly used for the left and right systems. In FIG. 16, a relatively large opening 13 is formed. FIG. 17 shows a modification wherein left and right ducts 8 and 8' have different lengths l and l', and the left and right systems have different tuning frequencies (resonance frequencies of the Helmholtz resonators). Such a 3D system is preferably used in a radio/cassette tape recorder, a TV, and the like.

In the above embodiments, the opening 13 may have desired shapes, e.g., a circular, rectangular shape, and the like, and may be replaced with the passive vibrating body 16 shown in FIGS. 6 and 14. In the embodiments shown in FIGS. 13 and 14, the passive vibrating body 16 may be replaced with the opening 13 shown in FIG. 11 and the like.

What is claimed is:

1. An acoustic apparatus, comprising:

a first enclosure defining a first chamber;

a second enclosure defining a second chamber;

a duct for causing the first and second chambers to communicate with each other, the duct constituting a Helmholtz resonator together with the first enclosure;

a vibrator mounted to the first enclosure, the vibrator having an inner surface which faces inside the first enclosure and an opposing outer surface, the vibrator directly externally radiating an acoustic wave from the outer surface and driving the Helmholtz resonator by the inner surface;

an opening formed in the second enclosure and constituting a low-pass type acoustic filter together with the second enclosure, the acoustic filter having a cutoff frequency which is set to be higher than a resonance frequency of the Helmholtz resonator and to be lower than an open duct resonance frequency of the duct; and a vibrator driver for driving the vibrator to cancel an air counteraction from the resonator when the Helmholtz resonator is driven.

2. An acoustic apparatus to claim 1, including a cabinet having a partition therein to define the first and second enclosures.

3. An acoustic apparatus according to claim 1, including first and second cabinets which are separated from each other, the first cabinet defining a first enclosure and the second cabinet defining a second enclosure.

4. An apparatus according to claim 1, further comprising a damping member for preventing resonance in the second enclosure.

5. An apparatus according to claim 1, wherein said opening port and duct are positioned opposite to each other.

6. An apparatus according to claim 3, wherein the first and second enclosures are disposed side by side in a row.

7. An acoustic apparatus, comprising:

a first enclosure defining a first chamber;

a second enclosure defining a second chamber;

a duct for causing the first and second chambers to communicate with each other, the duct constituting a Helmholtz resonator together with the first enclosure;

a vibrator mounted to the first enclosure, the vibrator having an inner surface which faces inside the first enclosure and an opposing outer surface, the vibrator directly externally radiating an acoustic wave from the outer surface and driving the Helmholtz resonator by the inner surface;

a fully passive vibrating body mounted to the second enclosure and constituting a low-pass type acoustic filter together with the second enclosure, the acoustic filter having a cutoff frequency which is set to be higher than a resonance frequency of the Helmholtz resonator and to be lower than an open duct resonance frequency of the duct; and a vibrator driver for driving the vibrator to cancel an air counteraction from the resonator when the Helmholtz resonator is driven.

8. An acoustic apparatus to claim 7, including a cabinet having a partition therein to define the first and second enclosures.

9. An acoustic apparatus according to claim 7, including first and second cabinets which are separated from each other, the first cabinet defining a first enclosure and the second cabinet defining a second enclosure.

10. An apparatus according to claim 7, further comprising a damping member for preventing resonance in the second enclosure.

11. An acoustic apparatus, comprising:

a first enclosure defining a first chamber;

a second enclosure defining a second chamber, the second enclosure having a wall forming an opening to the surrounding air, the opening having a sound path length approximately equal to the wall thickness;

a duct for causing the first and second chambers to communicate with each other, the duct constituting a Helmholtz resonator together with the first enclosure, wherein the second enclosure and the opening constitute a low-pass type acoustic filter having a cut-off frequency which is set higher than a resonance frequency of the Helmholtz resonator and set lower than an open duct resonance frequency of the duct;

a vibrator mounted to the first enclosure, the vibrator having an inner surface which faces inside the first enclosure and an opposing outer surface, the vibrator directly externally radiating an acoustic wave from the outer surface and driving a Helmholtz resonator by the inner surface; and a vibrator driver for driving the vibrator to cancel an air counteraction from the resonator when the Helmholtz resonator is driven.

* * * * *

UNITED STATES PATENT AND TRADEMARK OFFICE
CERTIFICATE OF CORRECTION

PATENT NO. : 4,953,655

DATED : September 4, 1990

INVENTOR(S) : Kazunari Furukawa

It is certified that error appears in the above-identified patent and that said Letters Patent is hereby corrected as shown below:

Sheet 10 of 10 of the drawings should be deleted to appear as per attached sheet.

Signed and Sealed this

Seventh Day of January, 1992

*Attest:*

HARRY F. MANBECK, JR.

*Attesting Officer*

*Commissioner of Patents and Trademarks*

UNITED STATES PATENT AND TRADEMARK OFFICE
CERTIFICATE OF CORRECTION

PATENT NO. : 4,953,655

DATED : September 4, 1990

INVENTOR(S) : Kazunari Furukawa

It is certified that error appears in the above—identified patent and that said Letters Patent is hereby corrected as shown below:

U.S. Patent Sep. 4, 1990 Sheet 10 of 10 4,953,655

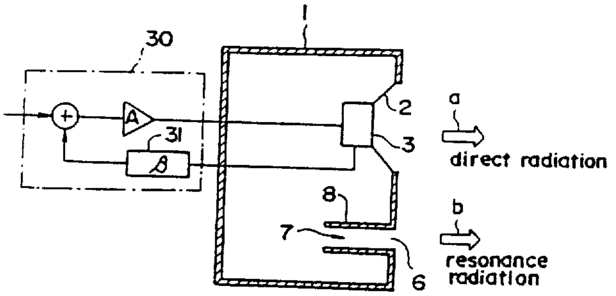

F I G. 20

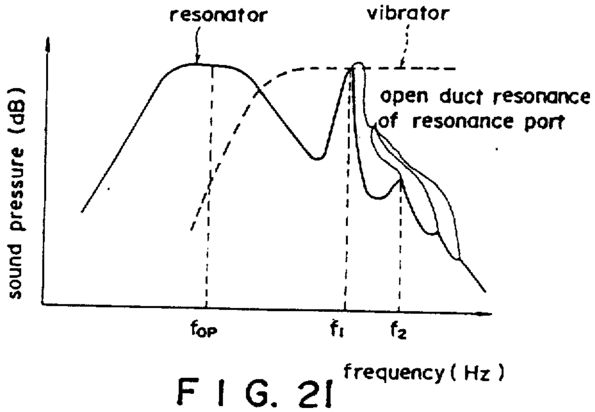

F I G. 21